(12) United States Patent
Park et al.

(10) Patent No.: US 6,356,319 B1
(45) Date of Patent: Mar. 12, 2002

(54) LIQUID CRYSTAL DISPLAY DEVICE AND METHOD OF MANUFACTURING THE SAME

(75) Inventors: Jae-Deok Park; Ju-Cheon Yeo, both of Kyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/629,952

(22) Filed: Aug. 1, 2000

(30) Foreign Application Priority Data

Aug. 2, 1999 (KR) .............................. 99-31744

(51) Int. Cl.[7] ...................... G02F 1/136; G02F 1/1333; G02F 1/13; H01L 29/04
(52) U.S. Cl. ..................... 349/43; 349/42; 349/122; 349/187; 257/59; 257/72
(58) Field of Search ............................ 349/42, 43, 122, 349/138, 187; 257/59, 72

(56) References Cited

U.S. PATENT DOCUMENTS 5,905,549 A * 5/1999 Lee .............................. 349/42
5,990,986 A * 11/1999 Song et al. ................... 349/43
6,038,002 A * 3/2000 Song ............................ 349/43

* cited by examiner

*Primary Examiner*—William L. Sikes
*Assistant Examiner*—Tarifur R. Chowdhury
(74) *Attorney, Agent, or Firm*—Long Aldridge & Norman LLP (57) ABSTRACT

The present invention discloses a liquid crystal display device including a first insulating substrate having: a) a buffer layer formed on the first substrate; b) an inter-layer insulating film formed on the buffer layer, the inter-layer insulating film having an etching portion, the etching portion is etched; c) a semiconductor island formed on a portion of the buffer layer corresponding to the etching portion; d) data lines formed on the semiconductor island; e) gate lines arranged in a direction perpendicular to the data lines; f) switching elements arranged near cross points of the gate and data lines, each of the switching element having a gate electrode, a source electrode and a drain electrode, the gate electrode extending from the gate line, the source electrode extending from the data line; and g) pixel electrodes formed on a region defined by the gate and data lines, the pixel electrode connecting with the drain electrode, the pixel electrode overlapping an end portion of the data line, the adjacent two pixel electrodes spaced apart from each other; a second insulating substrate having a color filter; and a liquid crystal layer interposed between the first and second insulating substrates.

32 Claims, 8 Drawing Sheets

(Related Art)

LIQUID CRYSTAL DISPLAY DEVICE AND METHOD OF MANUFACTURING THE SAME

CROSS REFERENCE

This application claims the benefit of Korean Patent Application No. 1999-31744, filed on Aug. 2, 1999, under 35 U.S.C. § 119, the entirety of which is hereby incorporated by reference.

BACKGROUND OF THE INVENTION

1. Field of the Invention

The present invention relates to a liquid crystal display device and a method of manufacturing the same.

2. Description of Related Art

In general, LCD devices have various advantages that they are thin in thickness and low in power consumption, and so on, in comparison with CRT (cathode ray tube) display devices. Therefore, such LCD devices might be expected to be substituted for CRT display devices and have been a matter of great interest in some industry fields.

A typical LCD device includes a liquid crystal panel and a back light device. The liquid crystal panel includes upper and lower substrates with a liquid crystal layer interposed therebetween. The upper substrate has a color filter, and the lower substrate has a thin film transistor (TFT) as a switching element. An upper polarizer is arranged on the upper substrate of the liquid crystal panel, and a lower polarizer is arranged between the lower substrate of the liquid crystal panel and the backlight device.

Figure 1:
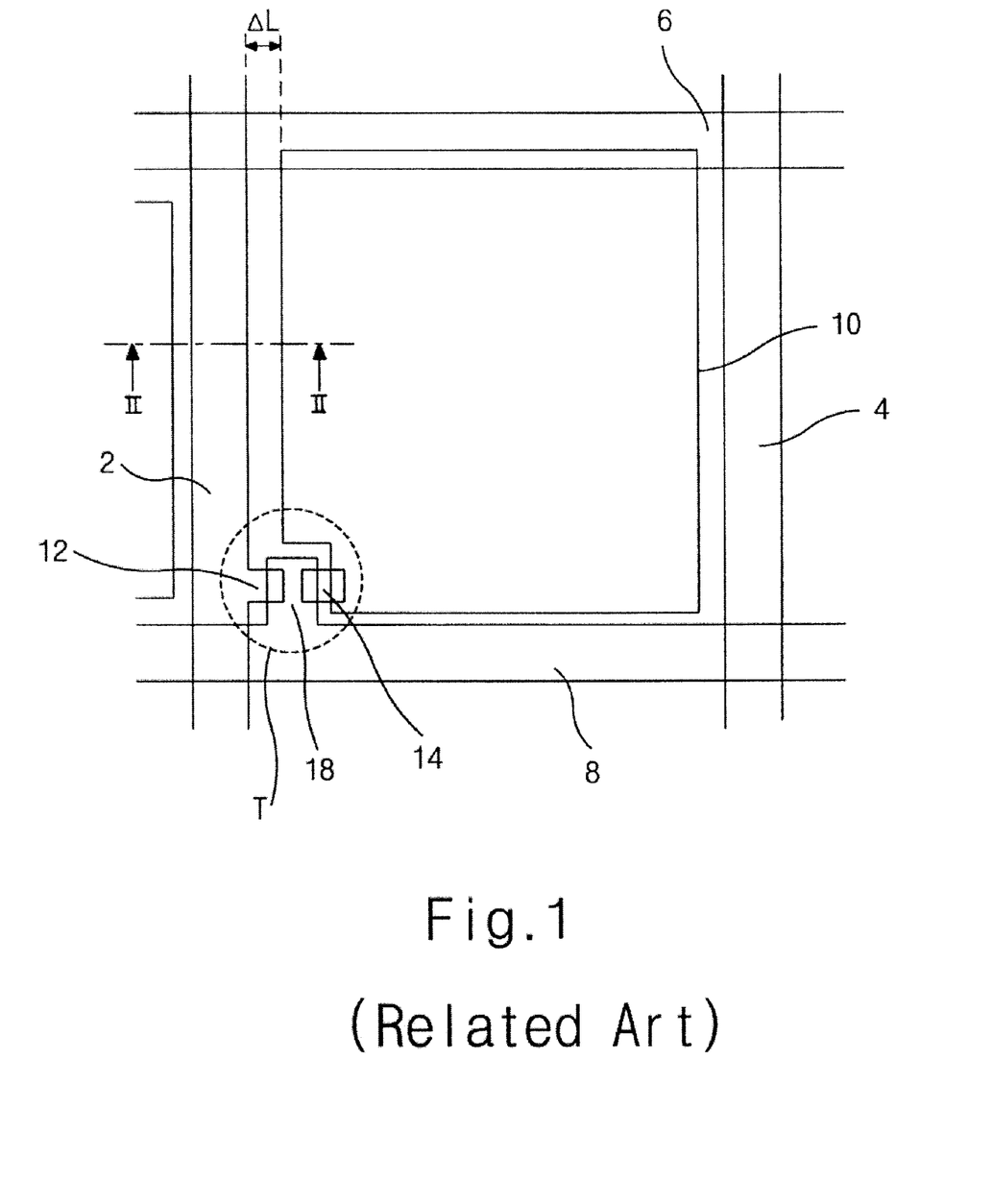

FIG. 1 is a plan view illustrating a portion of a conventional liquid crystal display (LCD) device corresponding to one pixel. As shown in FIG. 1, the lower substrate includes gate lines 6 and 8 arranged in a transverse direction, data lines 2 and 4 arranged in a longitudinal direction perpendicular to the gate lines 6 and 8, and thin film transistors "T" (TFTs) formed near the cross point of the gate and data lines 2 and 8. Each of the TFTs "T" has a gate electrode 18, a source electrode 12 and a drain electrode 14. The gate electrode 18 is extended from the gate line 8, and the source electrode 12 is extended from the data line 12 and spaced apart from the drain electrode 14. The lower substrate further includes a pixel electrode 10 formed on a region defined by the gate lines 6 and 8 and the data lines 2 and 4. The pixel electrode 10 is electrically connected with the drain electrode 14 through a contact hole (not shown) and is usually made of a transparent conductive material such as indium tin oxide (ITO) and indium zinc oxide (IZO).

Figure 2:
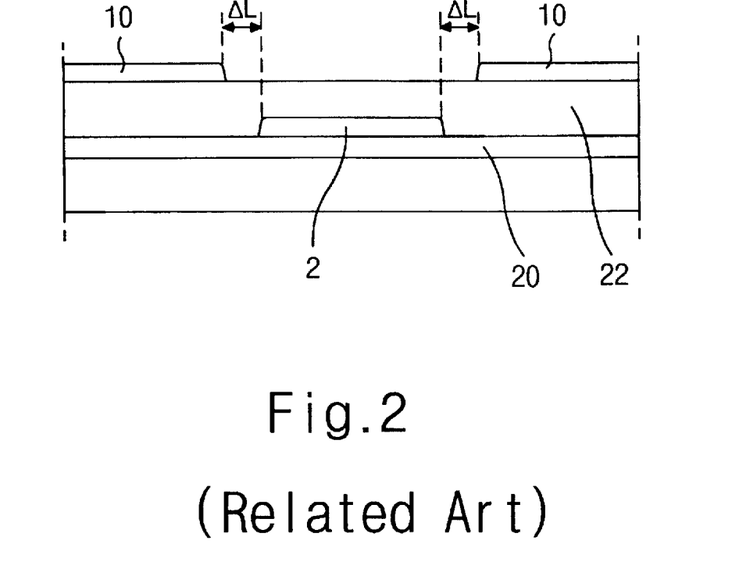
FIG. 2 is a cross sectional view taken along line—of FIG. 1, illustrating a structure of a data line and a pixel electrode according to the conventional art.

FIG. 2 is a cross sectional view taken along line—of FIG. 1. As shown in FIG. 2, a gate insulating layer 20 is formed on the substrate 1, and the data line 2 is formed on the gate insulating layer 20. A passavation film 22 is formed on the exposed surface of the gate insulating layer 20 while covering the data line 2. The pixel electrodes 10 are spaced apart from each other. This is to prevent a cross talk due to an electric field generated around the data line when electrical signals are applied to the data line. In other words, the data line 2 is located at a distance of ΔL from the pixel electrode 10.

The conventional LCD device having such a structure can reduce an affection of the cross talk, but has a disadvantage that an aperture ratio is reduced as long as ΔL plus an alignment margin because a black matrix has to cover a portion of ΔL.

Figure 3:
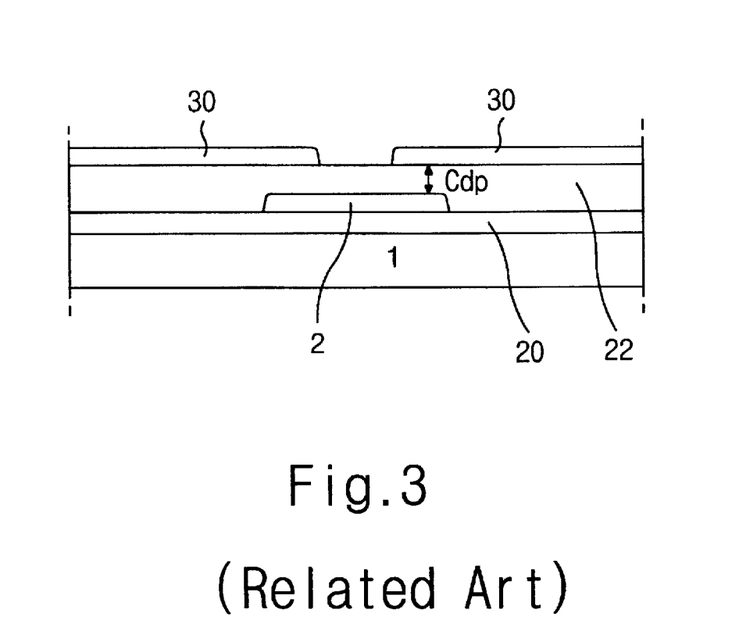
FIG. 3 is a cross sectional view illustrating a modified structure of the data line and the pixel electrode according to the conventional art.

In order to overcome such a problem, an another conventional LCD device having a structure shown in FIG. 3 is introduced. The two adjacent pixel electrodes 30 overlap both end portions of the data line 2, respectively. Thus, because the black matrix needs not be arranged to cover a portion in which the pixel electrodes 30 are distant from the data line 2, the LCD device can have a high aperture ratio.

However, a parasitic capacitor may be formed vertically between the pixel electrode 30 and the data line 2, leading to causing a cross talk. As the parasitic capacitance "Cdp" between the pixel electrode 30 and the data line 2 increases, display distortion due to a cross talk gets worse. In addition, when the step and repeat method type exposure is employed in manufacturing process of the LCD device, because the mask having the same pattern is used several times during one process, an alignment error of about 0.4 μm to about 0.5 μm may occurs centering on an imaginary boundary line between adjacent two portions to be exposed to light. Due to an alignment error, areas of the parasitic capacitors may become to differ and thus a capacitance difference may occur between the adjacent two parasitic capacitors. Such a capacitance difference affects brightness and a display distortion may be displayed near the imaginary boundary line between adjacent two portions to be exposed to light.

Such a capacitance of the parasitic capacitor depends on a vertical distance between the pixel electrode 30 and the data line 2. In other words, as a vertical distance between the pixel electrode 30 and the data line 2 become large, the capacitance of the parasitic capacitor becomes small.

Figure 4:
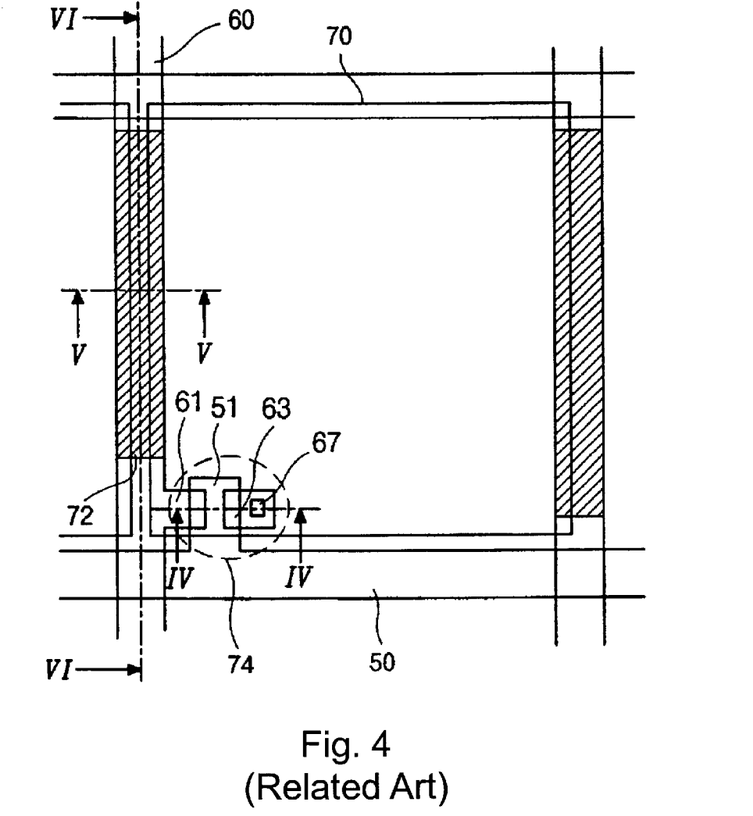
FIG. 4 is a plan view illustrating another conventional liquid crystal display device.
Figure 5:
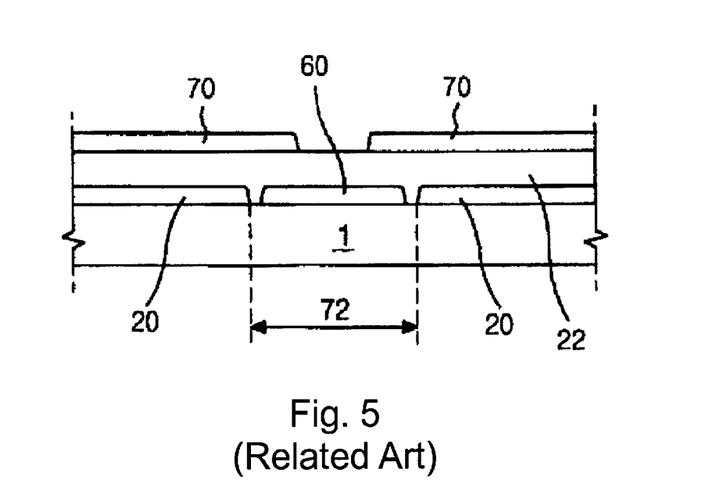
FIG. 5 is a cross sectional view taken along line—of FIG. 4.
Figure 6:
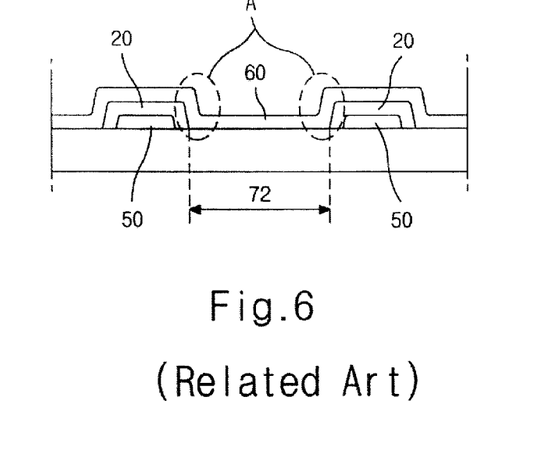
FIG. 6 is a cross sectional view taken along line—of FIG. 4.

FIG. 4 is a plan view illustrating an another conventional LCD device disclosed in Japanese Patent Application No. 10-274782. The LCD device is also introduced to prevent such a cross talk. FIG. 4 is a cross sectional view taken along line—of FIG. 4, and FIG. 6 is a cross sectional view taken along line—of FIG. 4. As shown in FIG. 4, the conventional LCD device includes a gate line 50 arranged in a transverse direction, a data line 60 arranged in a longitudinal direction perpendicular to the gate line 50, and thin film transistors 74 (TFTs) formed near the cross point of the gate and data lines 50 and 60. Each of the TFTs "T" has a gate electrode 51, a source electrode 61, and a drain electrode 63. The gate electrode 51 is extended from the gate line 50, and the source electrode 61 is extended from the data line 60 and spaced apart from the drain electrode 63. The conventional LCD device further includes a pixel electrode 70 formed on a region defined by the gate line 50 and the data line 60. The pixel electrode 70 is electrically connected with the drain electrode 63 through a contact hole 67. At this point, except for a cross portion of the data line 60 and the gate line 50, the data line 60 is formed directly on the substrate 1.

Method of manufacturing the conventional LCD device described above is as follows. As shown in FIG. 5, a gate insulating layer 20 is formed on the substrate 1, and a portion 72 of the gate insulating layer 20 that the data line 60 will be formed is etched, except for a cross portion of the gate line 50 and the data line 60. Then, the data line 60 is formed at the portion 72 and the passivation film 22 is formed covering the data line 60 and the gate insulating layer 20. The pixel electrode 70 is formed on the passivation film 22, overlapping a portion of the passivation film 22 corresponding to an end portion of the data line 60. The tow adjacent pixel electrodes 70 are spaced apart from each other. In other words, a spaced distance between the adjacent two pixel electrode 30 is narrower than a width of the data line 72.

Since such a structure can have a lengthy vertical distance between the pixel electrode 70 and the data line 60, a capacitance of a parasitic capacitor vertically formed between the pixel electrode 70 and the data line 60 can be reduced effectively, leading to reducing an affection of a cross talk. In other words, since a portion 72 of the gate insulating layer 20 is etched and thus the data line 60 is formed directly on the substrate 1, a thickness of the passivation film 22 over the data line 60 can increase as much as a thickness of the gate insulating layer 20. Therefore, the capacitance of a parasitic capacitor can be reduced. For example, if a thickness of the gate insulating layer 20 and a vertical distance between the substrate 1 and the pixel electrode 70 are 3000 and 5000 angstrom, respectively, the parasitic capacitance of 60% can be reduced.

However, the conventional LCD device having such a structure requires an additional process that etches a portion 72 of the gate insulating layer 20 that the data line 60 is formed directly on the substrate 1, leading to a lengthy processing time. Besides, as shown in FIG. 6, since a portion of the gate insulating layer 20 corresponding to the cross portion of the gate line 50 and the data line 60 is not etched, the data line 60 gets to have step portions "A" at a location corresponding to both end portions of the gate insulating layer 20 that is etched. Therefore, a line defect such as a line open of the data line 60 may occur at step portion "A".

SUMMARY OF THE INVENTION

To overcome the problems described above, preferred embodiments of the present invention provide a liquid crystal display device having good display characteristics and a short processing time.

In order to achieve the above object, in an aspect, a liquid crystal display device according to a preferred embodiment of the present invention includes a first insulating substrate and a second substrate with a liquid crystal layer interposed therebetween the second insulating layer includes a color filter the first insulating substrate includes a buffer layer formed on the first substrate and an inter-layer insulating film formed on the buffer layer. The inter-layer insulating film has an etching portion. The etching portion is etched. The first substrate further includes a semiconductor island. The semiconductor island is formed on a portion of the buffer layer corresponding to the etching portion. The first substrate further includes data lines formed on the semiconductor island and gate lines arranged in a direction perpendicular to the data lines. The first substrate further includes switching elements arranged near cross points of the gate and data lines. Each of the switching element having a gate electrode, a source electrode and a drain electrode. The gate electrode extends from the gate line, and the source electrode extends from the data line. The first substrate further includes pixel electrodes formed on a region defined by the gate and data lines. The pixel electrode connects with the drain electrode. The pixel electrode overlaps an end portion of the data line and the adjacent two pixel electrodes are spaced apart from each other.

The semiconductor island has a length and a width greater than the etching portion. Or the semiconductor island has a length and a width smaller than the etching portion. The switching element is a polysilicon thin film transistor. The semiconductor island is a polysilicon layer.

In another aspect, a liquid crystal display device according to the preferred embodiment of the present invention includes a first insulating substrate and a second insulating substrate with a liquid crystal layer interposed therebetween the second insulating substrate includes a color filter. The first substrate includes a buffer layer formed on the first substrate and an inter-layer insulating film formed on the buffer layer. The inter-layer insulating film has an etching portion. The etching portion is etched. The first substrate further includes data lines formed on the semiconductor island and gate lines arranged in a direction perpendicular to the data lines and switching elements arranged near cross points of the gate and data lines. Each of the switching element has a gate electrode, a source electrode and a drain electrode. The gate electrode extends from the gate line and the source electrode extends from the data line. The first substrate further includes pixel electrodes formed on a region defined by the gate and data lines. The pixel electrode connects with the drain electrode. The pixel electrode overlaps over an end portion of the data line and the adjacent two pixel electrodes are spaced apart from each other. At this point, both end portions of the etching portion adjacent to the cross potion of the gate and data lines has a greater length than its width. The first insulating substrate further includes semiconductor islands formed on portions of the buffer layer corresponding to the both end portions of the etching portion.

In another aspect, a method of manufacturing a liquid crystal display device according to the preferred embodiment of the present invention includes forming a buffer layer on a substrate; forming a semiconductor island and an active area on the buffer layer; forming sequentially a gate electrode and a gate insulating layer on the active area; ion-doping the active area using the gate electrode as a mask to form source and drain regions; depositing an inter-layer insulating film over the whole surface of the substrate and covering the semiconductor layer and the active area and the gate electrode; forming simultaneously an etching portion and source and first drain contact holes, the etching portion located a location corresponding to the semiconductor island, the source and first drain contact hole located on the source and drain regions, respectively; forming a data line on the semiconductor island, a source electrode, and a drain electrode, the source electrode electrically connecting with the source region through the source contact hole, the drain electrode electrically connecting with the drain region through the first drain contact hole; forming a passivation film over the whole surface of the substrate and covering the data line and the source and drain electrode, the passivation film having a second drain contact hole on a portion of the drain electrode; and forming a pixel electrode on the passivation film, the pixel electrode electrically connecting with the drain electrode through the second drain contact hole.

The passivation film is made of benzocyclobutent (BCB). The semiconductor island and the active area are a polysilicon layer.

As described herein before, the method of manufacturing the LCD device according to the preferred embodiment of the present invention has the following advantages. Firstly, by using the semiconductor island as an etch stopper when the inter-layer insulating film is etch to form the etching portion, a line open of the data line due to a step difference can be prevented. Secondly, since the data line is formed on the etching portion and thus a vertical distance between the pixel electrode and the data line increase, a capacitance of the parasitic capacitance vertically formed between the pixel electrode and the data line can be reduced, whereupon an affection of the cross talk can be reduced remarkably. Thirdly, a length of the two end portions of the etching portion adjacent to the cross portion of the gate and data lines have a protruding or a recess portion and thus is greater than its width, a step difference of the two end portion of the etching portion adjacent to the cross portion of the gate and data lines can be reduced. Fourthly, since the etching portion is formed at the same time as the source and drain contact holes, an additional process is not required. Fifthly, since a capacitance of the parasitic capacitor vertically formed between the pixel electrode and the data line is sufficiently small not to affect the display characteristics, regardless of the capacitance of the parasitic capacitor, the display characteristics can be improved.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIG. 1a plan view illustrating a conventional liquid crystal display device;

FIGS. 11 and 12 are plan views illustrating another modification of the liquid crystal display device according to the preferred embodiment of the present invention.

DETAILED DESCRIPTION OF PREFFERED EMBODIMENTS

Reference will now be made in detail to the preferred embodiment of the present invention, example of which is illustrated in the accompanying drawings.

Figure 7:
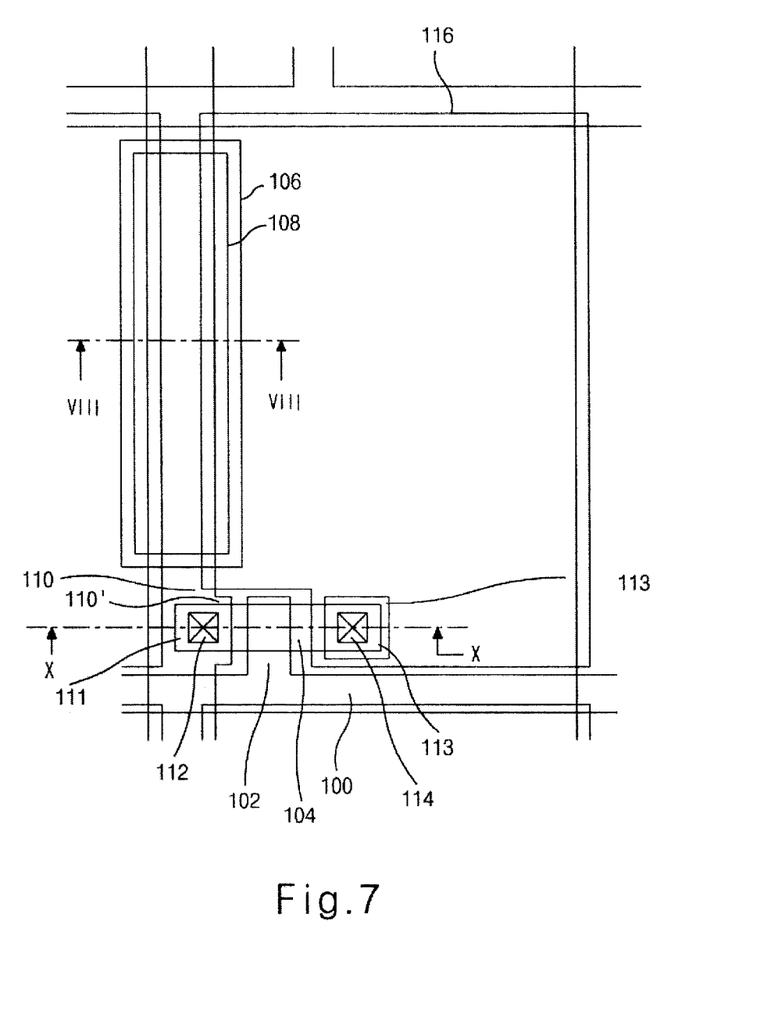
FIG. 7 is a plan view illustrating a liquid crystal display device according to a preferred embodiment of the present invention.

FIG. 7 is a plan view illustrating a liquid crystal display (LCD) device according a preferred embodiment of the present invention. As shown in FIG. 7, the LCD device includes gate lines 100 arranged in a transverse direction, data lines 110 arranged in a longitudinal direction perpendicular to the gate lines, and switching elements arranged near the cross points of the gate and data lines 100 and 110.

As a switching element, the preferred embodiment of the present invention uses a polysilicon thin film transistor (TFT). Each of the TFTs has a gate electrode 102 and an active area 104. The gate electrode 102 is extended from the gate line 100. The active area includes a source region 111 and a drain region 113. The source region 111 contacts the data line 110 through a source contact hole 112, and the drain region 113 contacts a pixel electrode 116 through a drain contact hole 114. The pixel electrode 116 is formed on a region defined by the gate and data lines 100 and 110. The pixel electrode 116 overlaps a portion of the data line 110.

Figure 8:
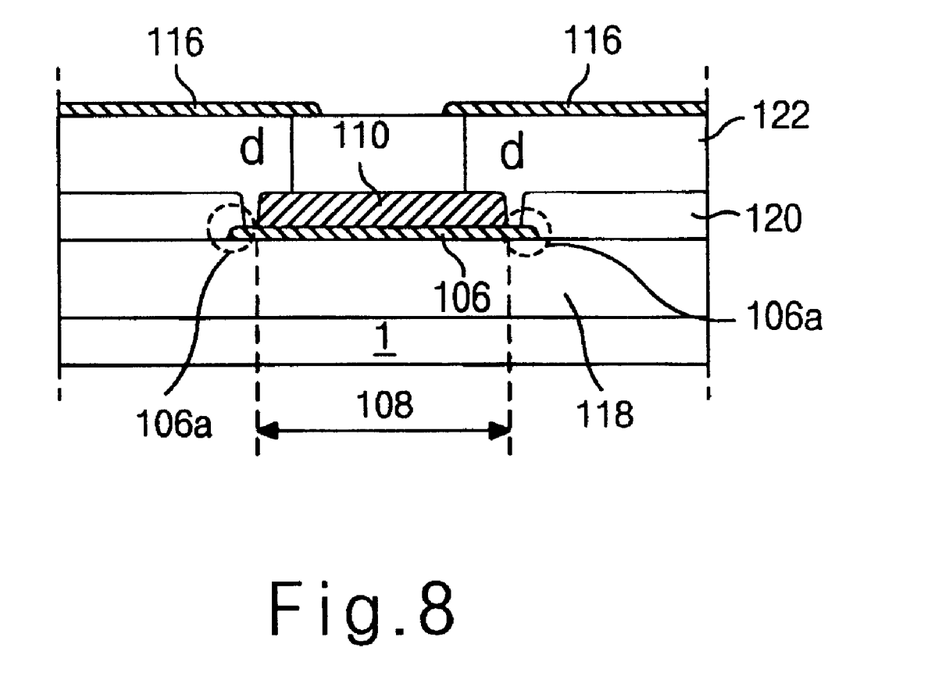
FIG. 8 is a cross sectional view taken along line—of FIG. 7.

FIG. 8 is a cross sectional view taken along line—of FIG. 7. A buffer layer 118 is formed on a substrate 1. An inter-layer insulating film 120 is formed on the buffer layer 118. The inter-layer insulating film 120 has an etching portion 108 to be etched. A semiconductor island 106 is formed on a location corresponding to the etching portion 108 on the buffer layer 118. It is preferred that the etching portion 108 is smaller in length and width than the semiconductor island 106 (see FIG. 7). Both end portions 106a of the semiconductor island 106 are overlapped by the inter-layer insulating layer 120. In other words, the semiconductor island 106 is formed before the inter-layer insulating film 120. The data line 110 is formed on the semiconductor island 106. A passivation film 122 is formed covering the inter-layer insulating layer 120 and the data line 110. The pixel electrode 116 is formed on the passivation film 122 and overlaps a portion of the passivation film 122 over an end portion of the data line 110. The adjacent two pixel electrodes 116 are spaced apart from each other. The semiconductor island 106 serves as an etch stopper to prevent an over-etching. As compared with the conventional LCD device of FIG. 3, a vertical distance "d" between the pixel electrode 116 and the data line 110 is more distant, whereupon the parasitic capacitance can be reduced remarkably.

Figure 9A:
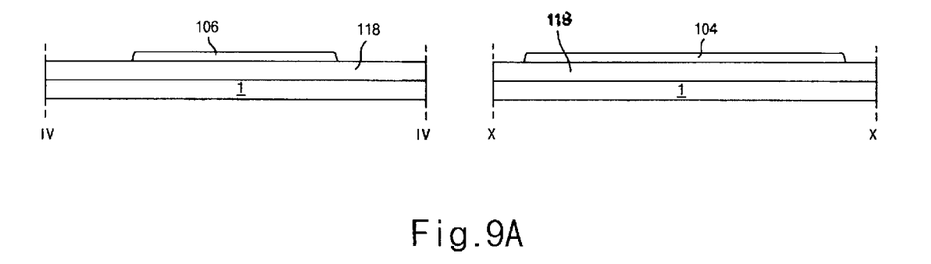
FIGS. 9A to 9E are cross sectional view, respectively, taken along lines—and—of FIG. 7, illustrating a process of manufacturing the liquid crystal display device accordingly to the preferred embodiment of the present invention.
Figure 9B:
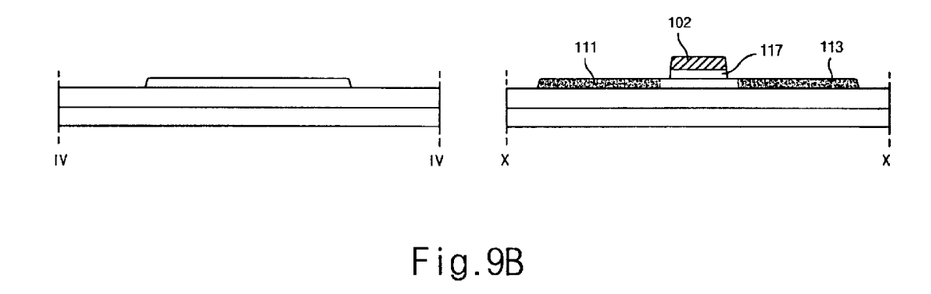
Figure 9C:
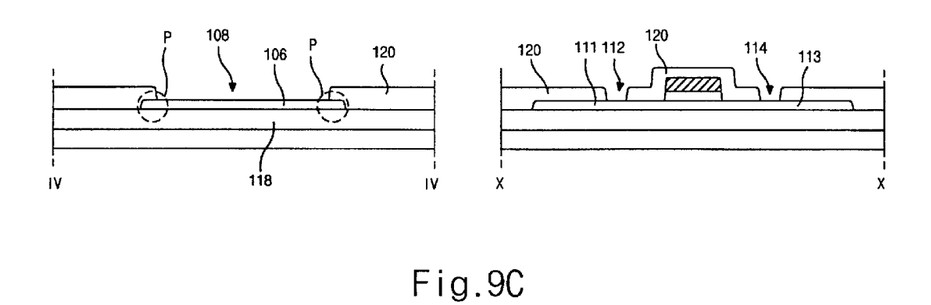
Figure 9D:
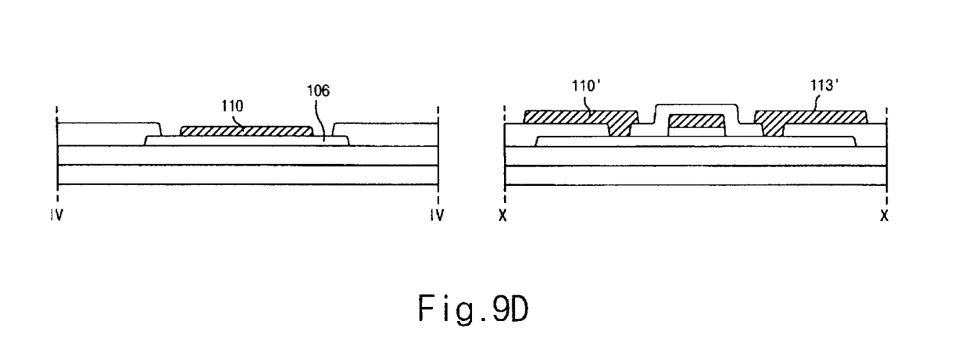
Figure 9E:
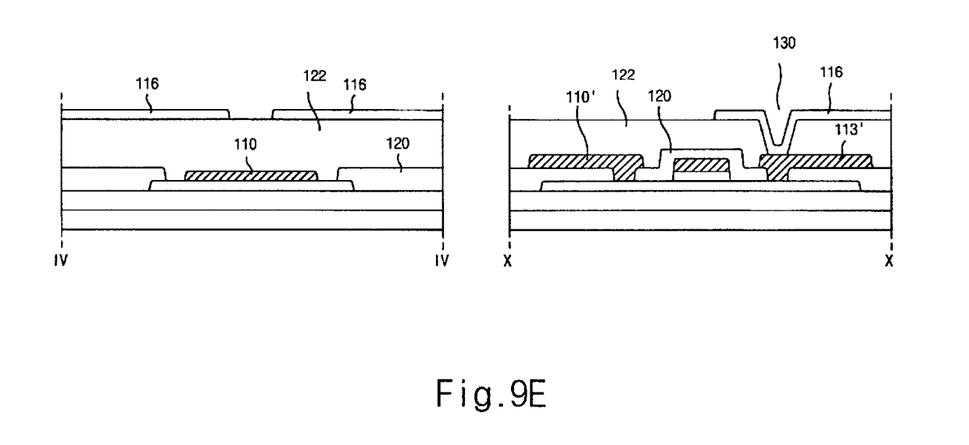

A method of manufacturing the LCD device according to the preferred embodiment of the present invention is explained with reference to FIGS. 9A through 9E. First, as shown in FIG. 9A, the buffer layer 118 is formed on the substrate 1 and then the semiconductor island 106 and the active area 104 are formed on the buffer layer 118, respectively. The buffer layer 118 serves to abstain an eruption of alkali materials that may occur from the substrate 1 during formation of the polysilicon layers 104 and 106. The polysilicon layers 104 and 106 is formed by crystallization of an amorphous silicon layer. The crystallization is performed using either of a laser annealing technique, a solid phase crystallization technique, a furnace annealing technique or the like. Then, as shown in FIG. 9B, an insulating layer and a metal layer are deposited on the exposed surface of the buffer layer 118 while covering the active area 104 and patterned into a gate insulating layer 117 and a gate electrode 102. Sequentially, n- or p-type impurities is doped into the active area 104 using the gate electrode 102 as a mask to form the source and drain regions 111 and 113. As a result, the active area 104 includes the source and drain regions 111 and 113 and a pure active area 104'. At this point, when the active area 104 is doped by ion of a boron group, the source and drain regions 111 and 113 become a p-type semiconductor, and when the active area 104 is doped by ion of a nitrogen group, the source and drain regions 111 and 113 become an n-type semiconductor. As shown in FIG. 9C, the inter-layer insulating film 120 is deposited on the exposed surface of the buffer layer 118 while covering the gate electrode 102 and the polysilicon layers 104 and 106, and a portion of the inter-layer insulating film 120 on the semiconductor island 106 having a narrower width than the semiconductor island 106 is etched to form the etching portion 108. At the same time, predetermined portions of the inter-layer insulating film 120 on the source and drain regions 111 and 113 are also etched to form the source and drain contact holes 112 and 114. Since the etching portion 108 is formed at the same time as the source and drain contact holes 112 and 114, the method of manufacturing the inventive LCD device need not additional processes to form the etching portion 108, leading to reducing the processing time. As described above, the semiconductor island 106 acts as the etch stopper. In other words, if an etching process is performed to form the etching portion 108 without the semiconductor island 106, portions "P" of the inter-layer insulating film 120 may be over-etched to the buffer layer 118, leading to causing bad step characteristics. Then, as shown in FIG. 9D, a metal layer is deposited on the inter-layer insulating layer 120 while covering the whole surface of the substrate 1 and patterned into the data line 110 and the source and drain electrodes 110' and 113'. It is preferred that the data line 110 is narrower in width than the semiconductor island 106. Further, the semiconductor island 106 may be formed only on the portions "P" of the inter-layer insulating film 120. This is because the over-etching occurs most extremely at both side portions "P" of the inter-layer insulating film 120. Finally, as shown in FIG. 9E, the passivation film 122 is formed over the whole surface of the substrate while covering the data line 110 and the source and drain electrodes 110' and 113'. A portion of the passivation film 122 on the drain electrode 113' is etched to form a contact hole 130. The pixel electrode 116 is formed on the passivation film 122, contacting with the drain electrode 113' through the contact hole 130. The adjacent two pixel electrodes are spaced apart from each other and overlap portions of the passivation film 122 on both end portions of the data line 110. The passivation film 122 is made of an organic insulating material having a good flatness and a good transmittance and preferably of benzocyclobutent (BCB).

As described above, the method of manufacturing the LCD device according to the preferred embodiment of the present invention can prevent the over-etching by forming the semiconductor island 106 on a location corresponding to the etching portion 108, whereupon the line defect such as the line open due to the over-etching of the inter-layer insulating film 120 can be prevented. Further, by etching the inter-layer insulating film 120 and then forming the data line 110 on the semiconductor island 106, a vertical distance between the pixel electrode 116 and the data line 110 can be increase as long as a thickness of the inter-layer insulating film 120. Therefore, the parasitic capacitance vertically formed between the pixel electrode 116 and the data line 110 can be reduced, leading to reducing an affection of the cross talk and improving a display quality.

In the LCD device according to the preferred embodiment of the present invention, in order to increase a vertical distance between the pixel electrode 116 and the data line 110, the etching portion 108 of the inter-layer insulating film 120 on which is for the data line 110 to be formed is etched. At this time, without the semiconductor island 106, the buffer layer 118 may be over-etched. Particularly, the over-etching may occur extremely at both end portions "Q" of the etching portion 108 adjacent to the cross portion of the gate and data lines 100 and 110 (see the portion "A" of FIG. 6), leading to bad step characteristics. The bad step characteristics may cause the data line 110 to be open.

Figure 10:
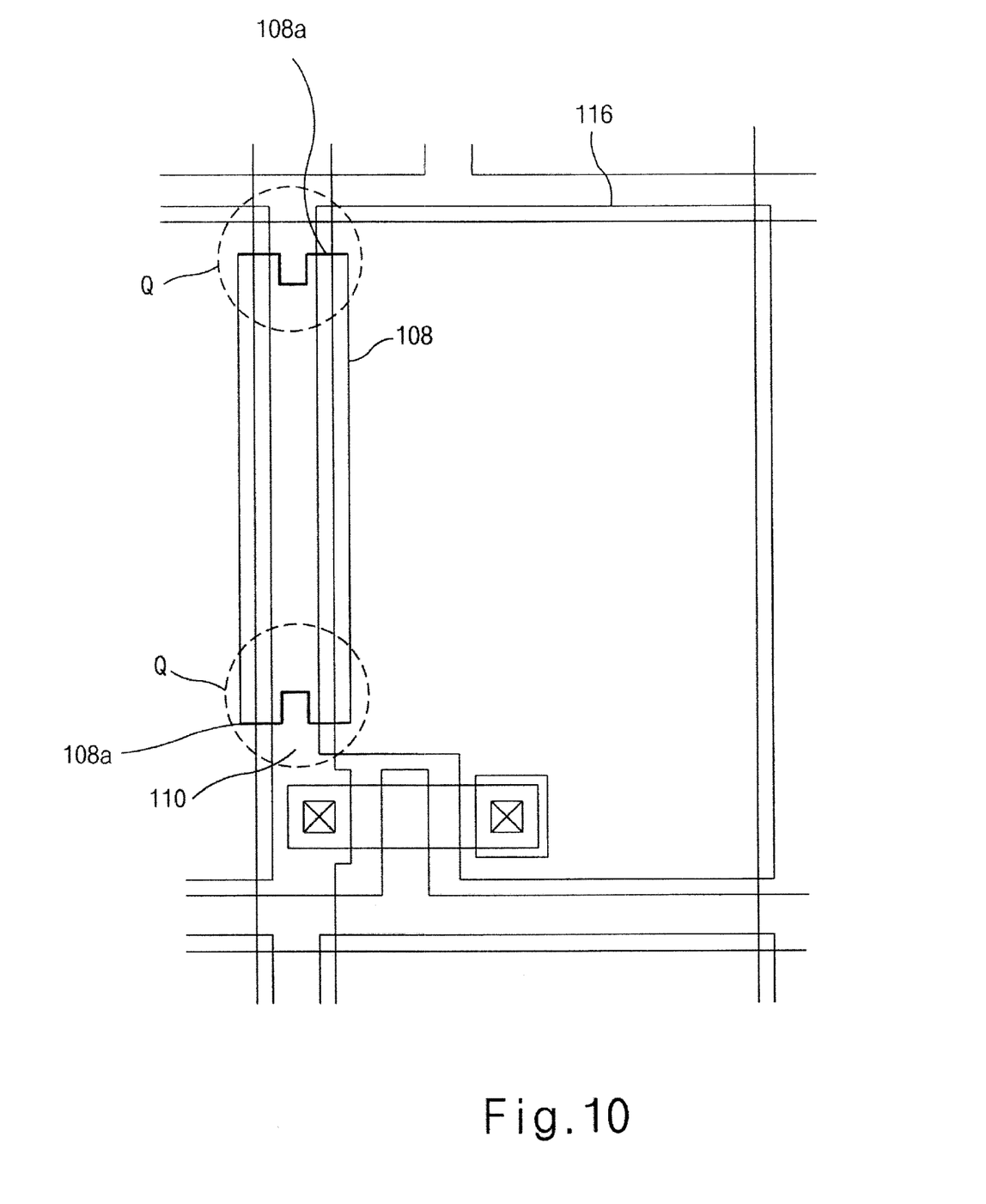
FIG. 10 is a plan view illustrating a modification of the liquid crystal display device according to the preferred embodiment of the present invention.

FIGS. 10 to 12 are plan views illustrating a structure to prevent such a possible line open of the data line. First, as shown in FIG. 10, The two end portions 108a of the etching portion 108 has a protruding or a recess portion. As a result, a length of the two end portion 108a of the etching portion 108 adjacent to the cross portion of the gate and data lines 100 and 110 gets to be greater than its width. Therefore, the over-etching can prevented and thus a line open can be prevented. Further, the two end portions 108a of the etching portion 108 may have a shape shown in FIG. 11.

Furthermore, as shown in FIG. 12, the semiconductor islands 106 having a greater width than width of the etching portion 108 are formed only on a location corresponding to the two end portions 108a of the etching portion 108 to prevent the over-etching and the two end portions 108a of the etching portion 108 may have a protruding or a recess portion.

As described herein before, the method of manufacturing the LCD device according to the preferred embodiment of the present invention has the following advantages. Firstly, by using the semiconductor island as an etch stopper when the inter-layer insulating film is etch to form the etching portion, a line open of the data line due to a step difference can be prevented. Secondly, since the data line is formed on the etching portion and thus a vertical distance between the pixel electrode and the data line increase, a capacitance of the parasitic capacitance vertically formed between the pixel electrode and the data line can be reduced, whereupon an affection of the cross talk can be reduced remarkably. Thirdly, a length of the two end portions of the etching portion adjacent to the cross portion of the gate and data lines have a protruding or a recess portion and thus is greater than its width, a step difference of the two end portion of the etching portion adjacent to the cross portion of the gate and data lines can be reduced. Fourthly, since the etching portion is formed at the same time as the source and drain contact holes, an additional process is not required. Fifthly, since a capacitance of the parasitic capacitor vertically formed between the pixel electrode and the data line is sufficiently small not to affect the display characteristics, regardless of the capacitance of the parasitic capacitor, the display characteristics can be improved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A liquid crystal display device comprising;
   a first insulating substrate having:
   a) a buffer layer formed on the first substrate;
   b) an inter-layer insulating film formed on the buffer layer, the inter-layer insulating film having an etching portion, the etching portion is etched;
   c) a semiconductor island formed on a portion of the buffer layer corresponding to the etching portion;
   d) data lines formed on the semiconductor island;
   e) gate lines arranged in a direction perpendicular to the data lines;
   f) switching elements arranged near cross points of the gate and data lines, each of the switching element having a gate electrode, a source electrode and a drain electrode, the gate electrode extending from the gate line, the source electrode extending from the data line; and
   g) pixel electrodes formed on a region defined by the gate and data lines, the pixel electrode connecting with the drain electrode, the pixel electrode overlapping an end portion of the data line, the adjacent two pixel electrodes spaced apart from each other;
   a second insulating substrate having a color filter; and
   a liquid crystal layer interposed between the first and second insulating substrates.

2. The liquid crystal display device of claim 1, wherein the semiconductor island has a length and a width greater than the etching portion.

3. The liquid crystal display device of claim 1, wherein the semiconductor island has a length and a width smaller than the etching portion.

4. The liquid crystal display device of claim 1, wherein the switching element is a polysilicon thin film transistor.

5. The liquid crystal display device of claim 1, wherein the semiconductor island is a polysilicon layer.

6. A liquid crystal display device comprising:
a first insulating substrate having:
   a) a buffer layer formed on the first substrate;
   b) an inter-layer insulating film formed on the buffer layer, the inter-layer insulating film having an etching portion, the etching portion is etched;
   c) data lines formed on the semiconductor island;
   d) gate lines arranged in a direction perpendicular to the data lines;
   e) switching elements arranged near cross points of the gate and data lines, each of the switching element having a gate electrode, a source electrode and a drain electrode, the gate electrode extending from the gate line, the source electrode extending from the data line; and
   f) pixel electrodes formed on a region defined by the gate and data lines, the pixel electrode connecting with the drain electrode, the pixel electrode overlapping over an end portion of the data line, the adjacent two pixel electrodes spaced apart from each other;
a second insulating substrate having a color filter; and
a liquid crystal layer interposed between the first and second insulating substrates,
wherein both end portions of the etching portion adjacent to the cross potion of the gate and data lines has a greater length than its width.

7. The liquid crystal display device of claim 6, wherein the first insulating substrate further includes semiconductor islands formed on portions of the buffer layer corresponding to the both end portions of the etching portion.

8. The liquid crystal display device of claim 6, wherein the switching element is a polysilicon thin film transistor.

9. The liquid crystal display device of claim 7, wherein the semiconductor island is a polysilicon layer.

10. A method of manufacturing a liquid crystal display device, comprising:
forming a buffer layer on a substrate;
forming a semiconductor island and an active area on the buffer layer;
forming sequentially a gate electrode and a gate insulating layer on the active area;
ion-doping the active area using the gate electrode as a mask to form source and drain regions;
depositing an inter-layer insulating film over the whole surface of the substrate and covering the semiconductor layer and the active area and the gate electrode;
forming simultaneously an etching portion and source and first drain contact holes, the etching portion located a location corresponding to the semiconductor island, the source and first drain contact hole located on the source and drain regions, respectively;
forming a data line on the semiconductor island, a source electrode, and a drain electrode, the source electrode electrically connecting with the source region through the source contact hole, the drain electrode electrically connecting with the drain region through the first drain contact hole;
forming a passivation film over the whole surface of the substrate and covering the data line and the source and drain electrode, the passivation film having a second drain contact hole on a portion of the drain electrode; and
forming a pixel electrode on the passivation film, the pixel electrode electrically connecting with the drain electrode through the second drain contact hole.

11. The method of claim 10, wherein the passivation film is made of benzocyclobutent (BCB).

12. The method of claim 10, wherein the semiconductor island and the active area are a polysilicon layer.

13. A liquid crystal display device comprising:
a first substrate:
   a buffer layer on said first substrate;
   a semiconductor island on said buffer layer;
   an inter-layer insulating film on said buffer layer, said insulating film having an etched portion that exposes a portion of said semiconductor island;
   a data line on said exposed portion of said semiconductor island;
   a gate line arranged in a direction perpendicular to said data lines;
   a switching element near the crossing of said gate line and said data line, said switching element having a gate electrode, a source electrode and a drain electrode, wherein said gate electrode extends from said gate line, and wherein said source electrode extends from said data line; and
   a first pixel electrode formed on a region defined by said gate line and by said data line, wherein said pixel electrode electrically connects to said drain electrode, and wherein said first pixel electrode overlaps a portion of said data line.

14. A liquid crystal display device according to claim 13, wherein said semiconductor island is partially covered by said insulating film.

15. A liquid crystal display device according to claim 13, wherein said switching element is a polysilicon thin film transistor.

16. A liquid crystal display device according to claim 13, wherein said semiconductor island is polysilicon.

17. A liquid crystal display device according to claim 13, further including a second pixel electrode that overlaps part of said data line.

18. A liquid crystal display device according to claim 13, wherein said first pixel electrode and said second pixel electrode are adjacent.

19. A liquid crystal display device comprising:
an insulating substrate:
   a buffer layer on said insulating substrate;
   a semiconductor island on said buffer layer;
   an inter-layer insulating film on the buffer layer, the inter-layer insulating film having an etched portion;
   a data line formed on said semiconductor island;
   a gate line arranged perpendicular to said data lines;
   a switching element arranged near a crossing of said gate line and said data line, said switching element having a gate electrode, a source electrode and a drain electrode, said gate electrode extending from said gate line and said source electrode extending from said data line; and
   a pixel electrode formed on a region partially defined by said gate and by said data line, wherein said pixel electrode electrically connects with said drain electrode, and wherein said pixel electrode overlaps a portion of said data line.

20. A liquid crystal display device according to claim 19, wherein said semiconductor island is overlapped by sides of said etched potion.

21. A liquid crystal display device according to claim 19, wherein said switching element is comprised of a polysilicon thin film transistor.

22. A liquid crystal display device according to claim 19, wherein said semiconductor island is polysilicon.

23. A method of manufacturing a liquid crystal display device, comprising:

forming a buffer layer on a substrate;

forming a semiconductor island and an active area on said buffer layer;

forming a gate electrode and a gate insulating layer on said active area;

ion-doping said active area to form source and drain regions;

depositing an inter-layer insulating film over exposed surfaces of said substrate so as to cover said semiconductor layer, said active area and said gate electrode;

forming an etched portion, a source contact hole, and a first drain contact hole through said inter-layer insulating film, wherein said etched portion exposes a portion of said semiconductor island, wherein said source contact hole exposes a portion of said source region, and wherein said first drain contact hole exposes a portion of said drain region.

24. A method of manufacturing a liquid crystal display device according to claim 23, further including forming a data line on said semiconductor island through said etched portion, forming a source electrode that electrically contacts said source region via said source contact hole, and forming a drain electrode that electrically contacts said drain electrode via said first drain contact hole.

25. A method of manufacturing a liquid crystal display device according to claim 24, further including forming a passivation film over the exposed surface of said substrate so as to cover said data line, said source electrode, and said drain electrode.

26. A method of manufacturing a liquid crystal display device according to claim 25, further including forming a second drain contact hole through said passivation film, wherein said second drain contact hole exposes a portion of said drain electrode.

27. A method of manufacturing a liquid crystal display device according to claim 26, further including forming a pixel electrode on said passivation film such that said pixel electrode electrically connects to said drain electrode via said second drain contact hole.

28. A method of manufacturing a liquid crystal display device according to claim 27, wherein said passivation film is comprised of benzocyclobutent (BCB).

29. A method of manufacturing a liquid crystal display device according to claim 23, wherein said semiconductor island is comprised of polysilicon.

30. A method of manufacturing a liquid crystal display device according to claim 29, wherein said polysilicon is formed by crystallizing amorphous silicon.

31. A method of manufacturing a liquid crystal display device according to claim 23, wherein said active area is comprised of polysilicon.

32. A method of manufacturing a liquid crystal display device according to claim 31, wherein said polysilicon is formed by crystallizing amorphous silicon.

* * * * *